(12) United States Patent
Qiu et al.

(10) Patent No.: US 10,593,641 B2
(45) Date of Patent: Mar. 17, 2020

(54) PACKAGE METHOD AND PACKAGE STRUCTURE OF FAN-OUT CHIP

(71) Applicant: SJ SEMICONDUCTOR (JIANGYIN) CORPORATION, JiangYin (CN)

(72) Inventors: Yuedong Qiu, JiangYin (CN); Chengchung Lin, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 13 days.

(21) Appl. No.: 15/560,965

(22) PCT Filed: May 20, 2016

(86) PCT No.: PCT/CN2016/082816
§ 371 (c)(1),
(2) Date: Sep. 22, 2017

(87) PCT Pub. No.: WO2017/124670
PCT Pub. Date: Jul. 27, 2017

(65) Prior Publication Data
US 2019/0006307 A1 Jan. 3, 2019

(30) Foreign Application Priority Data
Jan. 22, 2016 (CN) .......................... 2016 1 0046292

(51) Int. Cl.
*H01L 23/48* (2006.01)
*H01L 23/00* (2006.01)
(Continued)

(52) U.S. Cl.
CPC ............ *H01L 24/19* (2013.01); *H01L 21/568* (2013.01); *H01L 21/6835* (2013.01);
(Continued)

(58) Field of Classification Search
CPC ... H01L 23/5389; H01L 23/485; H01L 23/48; H01L 2924/18162; H01L 2224/24137; H01L 2224/12105
See application file for complete search history.

(56) References Cited

U.S. PATENT DOCUMENTS 7,388,288 B2 *  6/2008  Solzbacher ....... H01L 23/49811
                                                        257/738
8,698,301 B2 *  4/2014  Kwon ............... H01L 23/49811
                                                        257/686
(Continued)

FOREIGN PATENT DOCUMENTS

CN        103681371 A      3/2014
CN        104681456 A      6/2015
(Continued)

OTHER PUBLICATIONS

PCT International Search Report for application PCT/CN2016/082816 dated Oct. 31, 2016.

*Primary Examiner* — Hoa B Trinh
(74) *Attorney, Agent, or Firm* — Alston & Bird LLP

(57) ABSTRACT

A packaging method and a package structure of a fan-out chip are disclosed. The package structure comprises a first chip with bumps and a second chip without bumps, a first dielectric layer formed on a surface of the second chip and through-holes fabricated in the first dielectric layer; a plastic package material; a second dielectric layer; a metal redistribution layer for interconnecting within and between the first chip and the second chip; under bump metallization layers and micro-bumps. By fabricating the dielectric layers with the through-holes on the surfaces of the first chip and the second chip, exposing the bumps of the first chip and metal pads of the second chip and subsequently fabricating the metal redistribution layer, the interconnections within and between the first chip and the second chip are achieved (Continued)

and thereby the integrated package of the first chip and the second chip is achieved.

7 Claims, 4 Drawing Sheets

(51) Int. Cl.
    *H01L 25/065*     (2006.01)
    *H01L 21/683*     (2006.01)
    *H01L 23/538*     (2006.01)
    *H01L 23/528*     (2006.01)
    *H01L 21/56*     (2006.01)
    *H01L 23/485*     (2006.01)
    *H01L 23/31*     (2006.01)

(52) U.S. Cl.
    CPC ............ *H01L 23/48* (2013.01); *H01L 23/485* (2013.01); *H01L 23/528* (2013.01); *H01L 23/5389* (2013.01); *H01L 24/20* (2013.01); *H01L 25/0655* (2013.01); *H01L 23/3128* (2013.01); *H01L 2221/68372* (2013.01); *H01L 2221/68381* (2013.01); *H01L 2224/04105* (2013.01); *H01L 2224/12105* (2013.01); *H01L 2224/1357* (2013.01); *H01L 2224/13147* (2013.01); *H01L 2224/13655* (2013.01); *H01L 2224/18* (2013.01); *H01L 2224/24137* (2013.01); *H01L 2924/014* (2013.01); *H01L 2924/0105* (2013.01); *H01L 2924/01029* (2013.01); *H01L 2924/0132* (2013.01); *H01L 2924/01047* (2013.01); *H01L 2924/01079* (2013.01); *H01L 2924/18162* (2013.01)

(56) References Cited

U.S. PATENT DOCUMENTS

| | | | |
|---|---|---|---|
| 8,841,765 B2 * | 9/2014 | Haba | H01L 25/0652 |
| | | | 257/724 |
| 9,352,956 B2 * | 5/2016 | Cheng | B81B 7/0006 |
| 9,640,521 B2 * | 5/2017 | Chang | H01L 21/4853 |
| 9,893,046 B2 * | 2/2018 | Yang | H01L 25/50 |
| 2016/0276277 A1 * | 9/2016 | Syu | H01L 23/53228 |

FOREIGN PATENT DOCUMENTS

| | | |
|---|---|---|
| CN | 105161533 A | 12/2015 |
| CN | 105514071 A | 4/2016 |
| WO | WO 2017/124670 A1 | 7/2017 |

* cited by examiner

PACKAGE METHOD AND PACKAGE STRUCTURE OF FAN-OUT CHIP

CROSS REFERENCES

This application claims the benefit of priority to Chinese Patent Application No. CN 2016100462921, entitled "packaging method and package structure of fan-out chip", filed with the Chinese Patent Office on Jan. 22, 2016, and PCT application PCT/CN2016/082816, entitled "packaging method and package structure of fan-out chip", filed with WIPO on May 20, 2016, the contents of which are incorporated herein by reference in its entirety.

TECHNICAL FIELD

The present application relates to a packaging method and a package structure of a semiconductor chip, particularly relates to a packaging method and a package structure of a fan-out chip.

BACKGROUND

With rapid development of the integrated circuit manufacturing industry, requirements on integrated circuit packaging technologies continuously increase. The existing packaging technologies include a ball grid array (BGA) package, a chip scale package (CSP), a wafer level package (WLP), a three-dimensional (3D) package and a system in package (SiP) and the like, where the wafer level package (WLP) is gradually adopted by most semiconductor manufacturers because of their excellent advantages, all or most process steps thereof are completed on a silicon wafer with previous processes completed, and finally the wafer is directly cut into separated independent devices. The wafer level package (WLP) has the following unique advantages: (1) the packaging and processing efficiencies are high as multiple wafers can be simultaneously processed; (2) it has advantages of a flip chip packaging, i.e., lightweight, thin, short and small; (3) as compared with the previous processes, two processes, i.e., a pin redistribution (RDL) and a bump fabrication, are added, and all other processes are traditional processes; and (4) repetitive tests in the traditional package are decreased. Therefore, large IC package companies worldwide vigorously have studied, developed and produced wafer level package (WLP).

Using existing fan-out chip packaging technologies, solder bumps are fabricated until the semiconductor chip is cut. As a result, there may be some abnormal problems occur during the fabrication process, e.g., how to package semiconductor chips preformed with initial bumps, or how to achieve an interconnection between a chip having initial bumps and a chip not having initial bumps.

There are no effective methods to solve the problems in the prior arts which solve the problem of how to integrally package the chip having initial bumps and the chip having no initial bumps as well as how to achieve the interconnection therebetween.

In view of the above-mentioned reasons, there is a need to provide a packaging method and a package structure to effectively achieve the package of and the interconnection between a semiconductor chip with initial bumps and a chip without the initial bumps.

SUMMARY

The present application provides a packaging method for a fan-out chip, in particular it provides a packaging method and a package structure which may effectively achieve a package and an interconnection between a semiconductor chip with an initial bumps and a chip without initial bumps.

The present application provides a packaging method of a fan-out chip, comprising: step 1) providing a first chip with solder bumps and a second chip without solder bumps (use "bump" hereafter), forming a first dielectric layer on a surface of the second chip, and fabricating through-holes in the first dielectric layer; step 2) providing a carrier with a bonding layer formed on a surface thereof, and bonding the first chip and the second chip to the bonding layer; step 3) packaging the first chip and the second chip, wherein the bumps of the first chip and the through-holes of the first dielectric layer on the surface of the second chip are exposed after the package; step 4) depositing a second dielectric layer covering the first chip and the second chip, with windows opened over each bump of the first chip and the through-holes of the second chip; step 5) fabricating a metal redistribution layer aligned to the windows to achieve electrical interconnection of the first chip and the second chip; and step 6) fabricating under-bump metallization layers and micro-bumps on the metal redistribution layer.

As a preferred solution of the packaging method of the fan-out chip provided by the present disclosure, the packaging method of the fan-out chip further comprises a step 7) of removing the carrier and the bonding layer.

Preferably, the carrier comprises one of a glass slab, a transparent semiconductor material and a transparent polymer.

Preferably, the bonding layer comprises a UV bonding adhesive, and in the step 7), an exposure method is adopted for decreasing adhesiveness of the UV bonding adhesive to achieve a separation of the UV bonding adhesive from a plastic packaging material.

As a preferred solution of the packaging method of the fan-out chip provided by the present invention, the packaging method of the fan-out chip further comprises a step of bonding an adhesive tape to a surface of the first dielectric layer for protection after the step 1) of fabricating through-holes in the first dielectric layer, and a step of removing the adhesive tape after the step 3) of packaging.

As a preferred solution of the packaging method of the fan-out chip provided by the present invention, the first dielectric layer comprises one of silicon dioxide, phosphorus-silicate glass, silicon oxycarbide, silicon carbide and polymer.

As a preferred solution of the packaging method of the fan-out chip provided by the present invention, the dielectric layers are formed on the surfaces of the chips by adopting a spin-coating method, a chemical vapor deposition method or a plasma-enhanced chemical vapor deposition method.

As a preferred solution of the packaging method of the fan-out chip provided by the present invention, in the step 3), the plastic package material which has packaged the first chip and the second chip has a height not exceeding the heights of each bump and the first dielectric layer after the package, such that each bump and the first dielectric layer are exposed from the surface of the plastic package material.

As a preferred solution of the packaging method of the fan-out chip provided by the present invention, in the step 3), the plastic package material adopted for packaging the first chip and the second chip comprises one of polyimide, silica gel and epoxy resin.

As a preferred solution of the packaging method of the fan-out chip provided by the present invention, in the step 3), a process adopted for packaging the first chip and the second chip comprises one of a compression molding process, a printing process, a transfer molding process, a liquid sealant curing molding process, a vacuum laminating process and a spin-coating process.

As a preferred solution of the packaging method of the fan-out chip provided by the present invention, in the step 5), the metal redistribution layer is fabricated by adopting an evaporation process, a sputtering process, an electric plating process or a chemical plating process.

As a preferred solution of the packaging method of the fan-out chip provided by the present invention, a material of the metal redistribution layer comprises one of aluminum, copper, tin, nickel, gold and silver.

As a preferred solution of the packaging method of the fan-out chip provided by the present invention, the micro-bumps comprise one of gold-tin solder balls, silver-tin solder balls and copper-tin solder balls, or each of the micro-bumps comprises a copper post, a nickel layer formed on the copper post and a solder ball formed on the nickel layer.

The present invention further provides a package structure of a fan-out chip, comprising: a first chip with bumps and a second chip without bumps, a first dielectric layer formed on a surface of the second chip, and through-holes fabricated in the first dielectric layer; a plastic package material filled between the first chip and the second chip, with a height of the plastic package material not exceeding heights of each bump and the first dielectric layer, such that the bumps of the first chip and the through-holes in the first dielectric layer on the surface of the second chip are exposed; a second dielectric layer covering the first chip and the second chip, wherein the second dielectric layer has windows at each bump of the first chip and the through-holes of the second chip; a metal redistribution layer filled in each window and formed on the surface of the second dielectric layer for achieving electrical extractions of the first chip and the second chip and achieving an interconnection between the first chip and the second chip; under bump metallization layers and micro-bumps formed on the metal redistribution layer.

As a preferred solution of the package structure of the fan-out chip provided by the present invention, the first dielectric layer comprises one of silicon dioxide, phosphorus-silicate glass, silicon oxycarbide, silicon carbide and polymer.

As a preferred solution of the package structure of the fan-out chip provided by the present invention, the plastic package material comprises one of polyimide, silica gel and epoxy resin.

As a preferred solution of the package structure of the fan-out chip provided by the present invention, a material of the metal redistribution layer comprises one of aluminum, copper, tin, nickel, gold and silver.

As a preferred solution of the package structure of the fan-out chip provided by the present invention, the micro-bumps comprise one of gold-tin solder balls, silver-tin solder balls and copper-tin solder balls.

As a preferred solution of the package structure of the fan-out chip provided by the present invention, each of the micro-bumps comprises a copper post, a nickel layer formed on the copper post and a solder ball formed on the nickel layer.

As described above, the packaging method and the package structure of the fan-out chip provided by the present invention have the following beneficial effects: in the present invention, by fabricating the dielectric layers with the through-holes on the surfaces of the first chip with bumps and the second chip without bumps, exposing the bumps of the first chip and metal pads of the second chip and subsequently fabricating the metal redistribution layer, the electrical extractions of and an interconnection between the first chip and the second chip are achieved and thereby the integrated package of the first chip and the second chip is achieved. The present invention provides a method and a structure for effectively integrally packaging the first chip with bumps and the second chip without bumps, which has good effect and wide application prospect in the field of semiconductor package.

BRIEF DESCRIPTION OF THE DRAWINGS

FIG. 1 to FIG. 13 illustrate schematic views of structures presented in each step of a packaging method of a fan-out chip provided by the present invention, wherein FIG. 13 illustrates a structural schematic view of a package structure of a fan-out chip provided by the present invention.

DESCRIPTION OF COMPONENT REFERENCE NUMERALS

Figure 1:
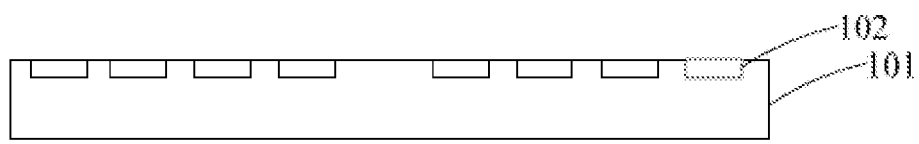

101 Second chip
102 Metal pad
103 First dielectric layer
104 Adhesive tape
201 First chip
202 Metal pad
203 Bump
301 Carrier
302 Bonding layer
303 Plastic package material
304 Second dielectric layer
305 Metal redistribution layer
306 Under bump metallization layer
307 Micro-bump

DETAILED DESCRIPTION OF THE PREFERRED EMBODIMENTS

The implementation modes of the present invention will be described below through specific examples. One skilled in the art can easily understand other advantages and effects of the present invention according to contents disclosed in the description. The present invention may also be implemented or applied through other different specific implementation modes. Various modifications or variations may be made to all details in the description based on different points of view and applications without departing from the spirit of the present invention.

It needs to be stated that the drawings provided in the embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

As illustrated in FIG. 1 to FIG. 13, this embodiment provides a packaging method of a fan-out chip, which comprises the following steps:

As illustrated in FIG. 1 to FIG. 8, firstly perform step 1): providing a second chip 101, forming a first dielectric layer 103 on a surface of the second chip 101 and fabricating through-holes in the first dielectric layer 103.

Figure 6:
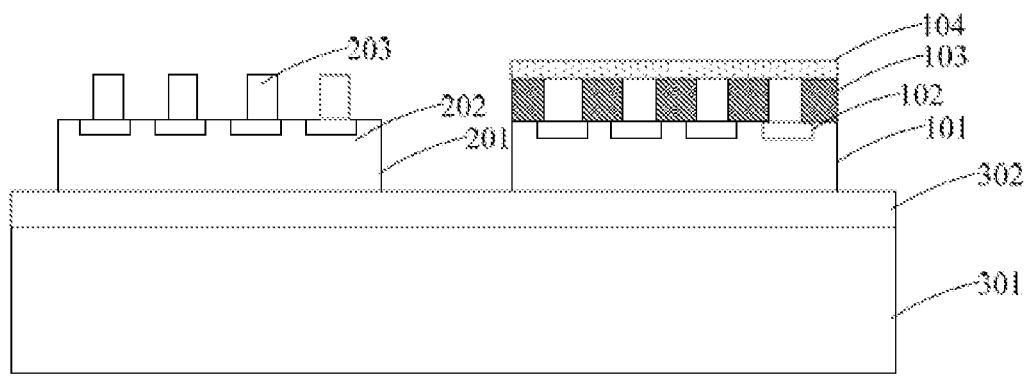

In FIG. 6 the bumps 203 are fabricated on metal pads 202 of the first chip 201.

As an example, the first dielectric layer 103 comprises materials such as silicon dioxide, phosphorus-silicate glass, silicon oxycarbide, silicon carbide and polymer.

As an example, the dielectric layers are formed on the surfaces of the chips by adopting a spin-coating method, a chemical vapor deposition method or a plasma-enhanced chemical vapor deposition method.

Figure 2:
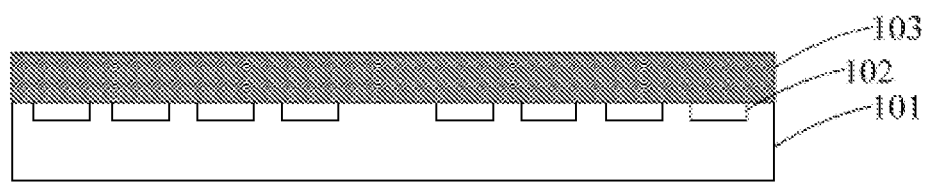

In this embodiment, the method comprises the following steps:

As illustrated in FIG. 1 to FIG. 2, firstly perform step 1-1): providing a substrate containing a second chip 101 having metal pads 102 and forming a silicon dioxide layer as the first dielectric layer 103 on the wafer by adopting the plasma-enhanced chemical vapor deposition method.

Figure 3:
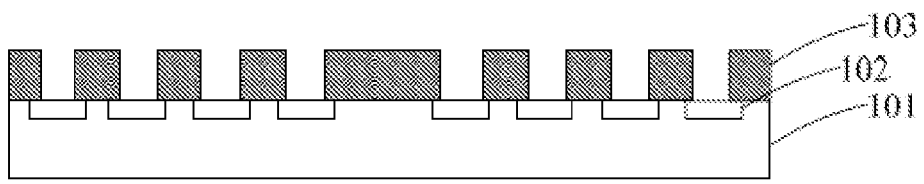

As illustrated in FIG. 3, then perform step 1-2): fabricating through-holes in the silicon dioxide layer by adopting a photolithography-etching process, wherein metal pads 102 of the second chip 101 are exposed from the through-holes.

Figure 4:
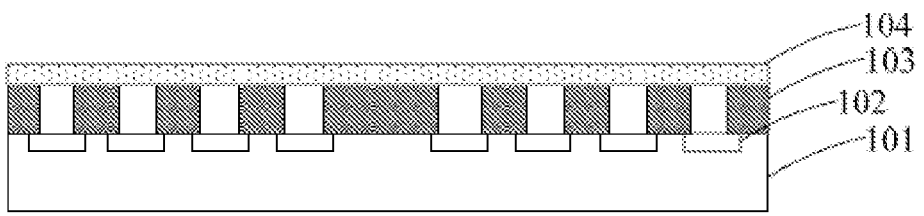

As illustrated in FIG. 4, then perform step 1-3): bonding an adhesive tape 104 to a surface of the first dielectric layer 103 (i.e., the silicon dioxide layer) for protection.

Figure 5:
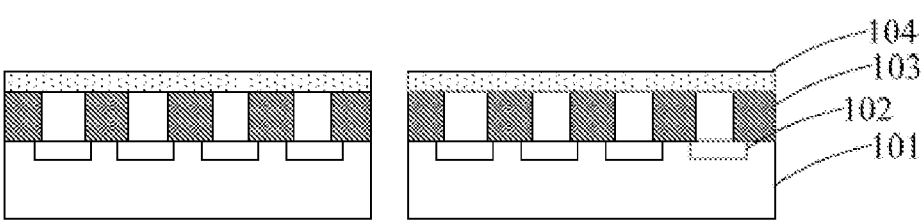

As illustrated in FIG. 5, finally perform step 1-4): splitting the wafer to obtain individual second chips 101.

As illustrated in FIG. 6, then perform step 2): providing a carrier 301 with a bonding layer 302 formed on its surface thereof, and bonding a first chip 201 and the second chip 101 to the bonding layer 302 side by side.

As an example, the bonding layer 302 may bean adhesive tape 104, or may be made of a material, e.g., an UV bonding adhesive prepared by a spin-coating method or epoxy resin or the like. In this embodiment, the bonding layer 302 is made of the UV bonding adhesive prepared by a spin-coating method and adhesiveness of the UV bonding adhesive maybe decreased under ultraviolet illumination.

As an example, the carrier 301 may be made of a material such as glass, ceramic, metal or polymer or the like. In this embodiment, the carrier 301 comprises one of a glass slab, a transparent semiconductor material and a transparent polymer, such that it may perform a subsequent exposure operation on the UV bonding adhesive from a back side of the carrier 301 and the subsequent stripping process can be greatly simplified.

Figure 7:
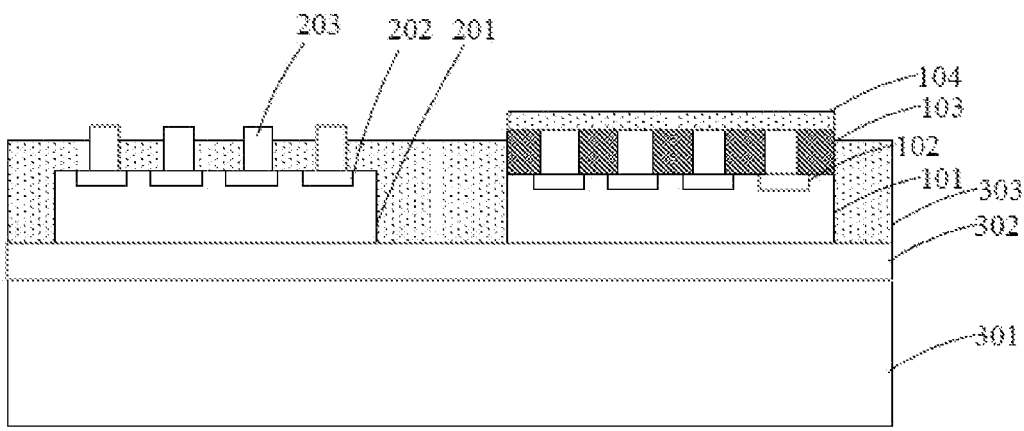
Figure 8:
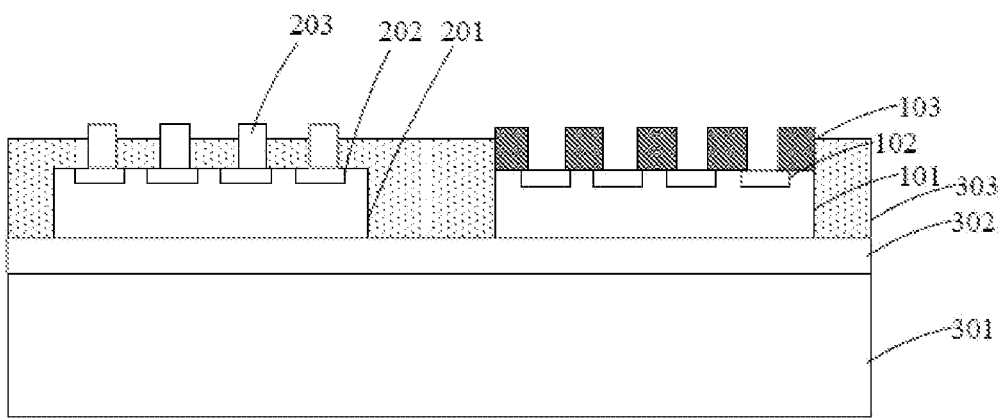

As illustrated in FIG. 7 to FIG. 8, perform step 3): packaging the first chip 201 and the second chip 101, then exposing the bumps 203 in the first chip 201 and the through-holes in the first dielectric layer 103 on the surface of the second chip 101 after the packaging, and removing the adhesive tape 104 over the second chip by tearing after the packaging.

As an example, the plastic package material 303 which has packaged the first chip 201 and the second chip 101 has a height not exceeding the heights of each bump 203 over the second chip and the post etching patterned first dielectric layer 103 after the package, such that each bump 203 and the patterned first dielectric layer 103 are exposed from the surface of the plastic package material 303.

As an example, the plastic package material 303 adopted for packaging the first chip 201 and the second chip 101 comprises one of the materials as polyimide, silica gel and epoxy resin, and the plastic package material 303 is a light-tight material prepared by adding an additive.

As an example, the process adopted for packaging the first chip 201 and the second chip 101 comprises one of a compression molding process, a printing process, a transfer molding process, a liquid sealant curing molding process, a vacuum laminating process and a spin-coating process. In this embodiment, the first chip 201 and the second chip 101 are packaged through an injection process and the plastic package material 303 is light-tight silica gel to be injected.

Figure 9:
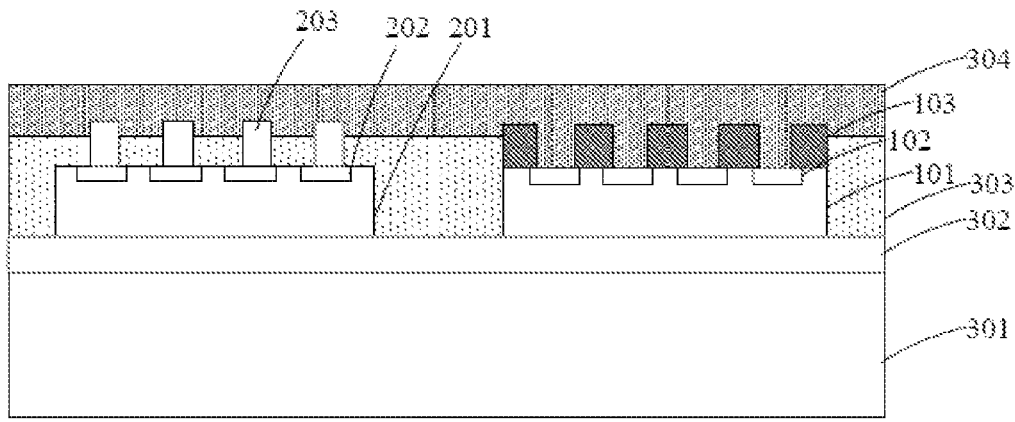
Figure 10:
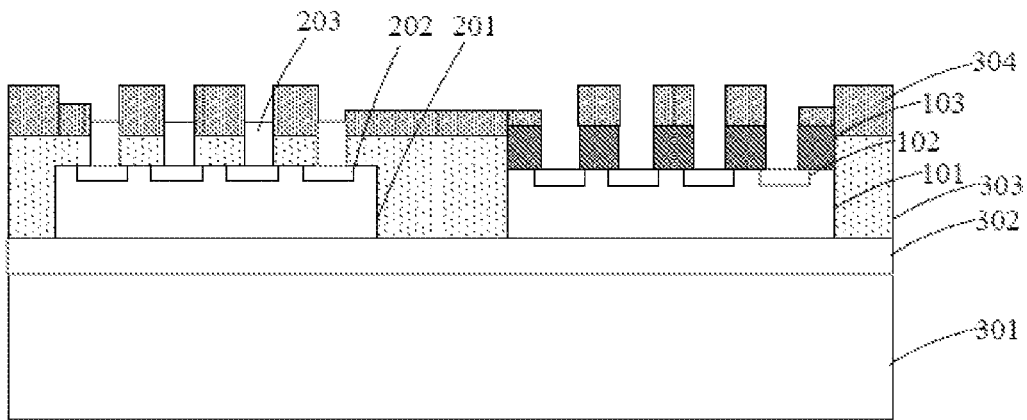

As illustrated in FIG. 9 to FIG. 10, then perform step 4): depositing a second dielectric layer 304 covering the first chip 201 and the second chip 101, with windows being opened at each bump 203 of the first chip 201 and the through-holes of the second chip 101.

As an example, the second dielectric layer 304 is a silicon dioxide layer prepared by adopting the plasma-enhanced chemical vapor deposition method, and windows are opened at each bump 203 of the first chip 201 and the through-holes of the second chip 101 by adopting the photoetching-etching process. Of course, a needed redistribution shape may be simultaneously etched in the second dielectric layer 304 as needed to facilitate the subsequent fabrication of a metal redistribution layer 305 as in FIG. 11.

Figure 11:
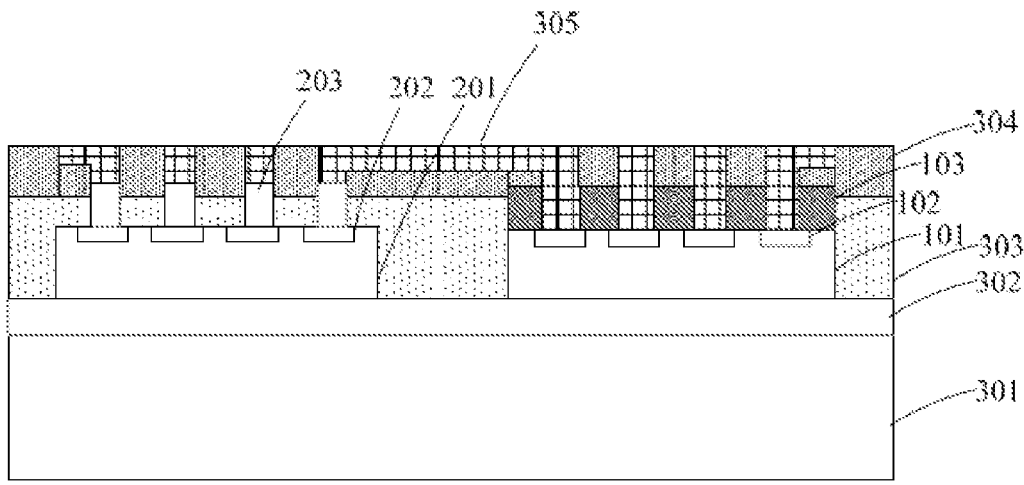

As illustrated in FIG. 11, then perform step 5): fabricating the metal redistribution layer 305 self-aligned to the recessed windows to achieve electrical connection between the first chip 201.

As an example, the metal redistribution layer 305 comprises two parts. The first part is used for pulling electrical leads of the first chip 201 and the second chip 101, and the second part is used for achieving the interconnection between the first chip 201 and the second chip 101.

As an example, the metal redistribution layer 305 is fabricated by adopting an evaporation process, a sputtering process, an electric plating process or a chemical plating process.

As an example, a material of the metal redistribution layer 305 comprises one of aluminum, copper, tin, nickel, gold and silver.

Figure 12:
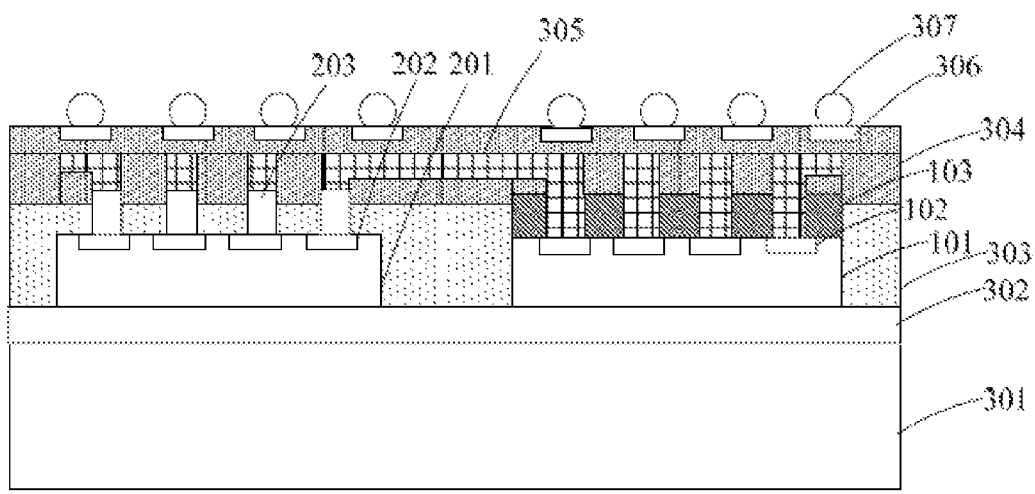

As illustrated in FIG. 12, then perform step 6): fabricating under-bump metallization layers 306 and micro-bumps 307 on the metal redistribution layer 305.

As an example, the micro-bumps 307 comprise gold-tin solder balls, silver-tin solder balls and copper-tin solder balls. The structure of the micro-bumps 307 each comprises a copper post, a nickel layer formed on the copper post and a solder ball formed on the nickel layer.

In a preferred embodiment, the micro-bumps 307 are gold-tin solder balls, and a fabrication method thereof comprises the following steps: first depositing and patterning gold-tin layers on the surfaces of the under-bump metallization layer 306, second, reflowing the gold-tin layers to form balls at a high-temperature reflow process, and third, decreasing temperature to freeze gold-tin solder balls.

Figure 13:
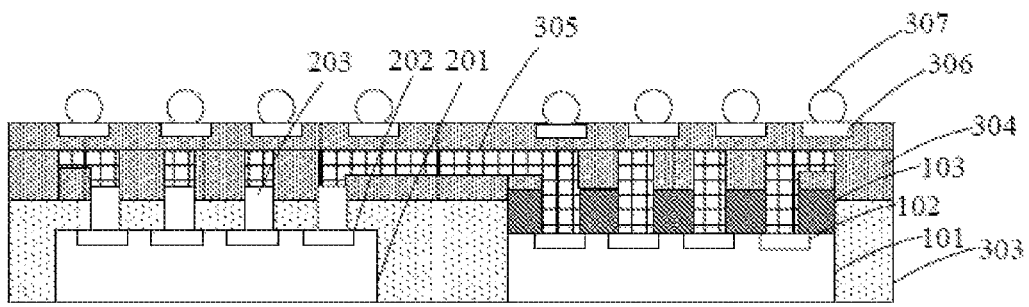

As illustrated in FIG. 13, finally perform step 7): removing the carrier 301 and the bonding layer 302.

As stated before, the bonding layer 302 comprises a UV bonding adhesive, and in the step 7), an exposure method is adopted for reducing adhesiveness of the UV bonding adhesive to achieve a separation of the UV bonding adhesive from the plastic package material 303.

As illustrated in FIG. 13, this embodiment results in a package structure of a fan-out chip, comprising: a first chip 201 with bumps 203 and a second chip 101 without bumps, a first dielectric layer 103 formed on a surface of the second chip 101 and through-holes fabricated in the first dielectric layer 103; a plastic package material 303 filled between the first chip 201 and the second chip 101, with a height of the plastic package material 303 not exceeding heights of each bump 203 and the first dielectric layer 103 such that the bumps 203 of the first chip 201 and the through-holes in the first dielectric layer 103 on the surface of the second chip 101 are exposed; a second dielectric layer 304 covering the first chip 201 and the second chip 101, wherein the second dielectric layer 304 has windows at each bump 203 of the first chip 201 and the through-holes of the second chip 101; a metal redistribution layer 305 filled in each window and formed on the surface of the second dielectric layer 304 for achieving electrical extractions of the first chip 201 and the second chip 101 and achieving the interconnection between the first chip 201 and the second chip 101; under bump metallization layers 306 and micro-bumps 307 formed on the metal redistribution layer 305.

As an example, the first dielectric layer 103 comprises one of silicon dioxide, phosphorus-silicate glass, silicon oxycarbide, silicon carbide and polymer.

As an example, the plastic package material 303 comprises one of polyimide, silica gel and epoxy resin.

As an example, a material of the metal redistribution layer 305 comprises one of aluminum, copper, tin, nickel, gold and silver.

As an example, the micro-bumps 307 comprise one of gold-tin solder balls, silver-tin solder balls and copper-tin solder balls.

As an example, each of the micro-bumps 307 comprises a copper post, a nickel layer formed on the copper post and a solder ball formed on the nickel layer.

As described above, the packaging method and the package structure of the fan-out chip provided by the present disclosure have the following beneficial effects: in the present disclosure, by fabricating the dielectric layers with the through-holes on the surfaces of the first chip 201 with bumps 203 and the second chip 101 without bumps, exposing the metal pads of the bumps 203 of the first chip 201 and the metal pads of the second chip 101 and subsequently fabricating the metal redistribution layer 305, the electrical extractions of and the interconnection between the first chip 201 and the second chip 101 are achieved and thereby the integrated package of the first chip 201 and the second chip 101 is achieved. The present disclosure provides a method and a structure for effectively integrally packaging the first chip 201 with bumps 203 and the second chip 101 without bumps. This technique has good effect and wide application prospect in the field of semiconductor packaging. Therefore, the present disclosure effectively overcomes various disadvantages in the prior arts and thus has a great industrial utilization value.

The above-mentioned embodiments are just used for exemplarily describing the principle and effects of the present invention instead of limiting the present invention. One skilled in the art may make modifications or changes to the above-mentioned embodiments without departing from the spirit and the scope of the present invention. Therefore, all equivalent modifications or changes made by one skilled having common knowledge in the art without departing from the spirit and technical concept disclosed by the present invention shall be still covered by the claims of the present invention.

What is claimed is:

1. A package structure of a fan-out chip, comprising:
   a first chip, wherein the first chip is connected electrically with one or more bumps;
   a second chip, wherein the second chip is not connected electrically with bumps, wherein a first dielectric layer is formed on a surface of the second chip, and wherein a plurality of through-holes [fabricated in the first dielectric layer;
   a plastic package material filled in a space between the first chip and the second chip and the bumps over the first chip, wherein a height of the plastic package material does not exceed either heights of said bumps or a height of the first dielectric layer, such that the one or more bumps of the first chip and the plurality of through-holes in the first dielectric layer on the surface of the second chip are exposed from top during filling of the plastic package material;
   a second dielectric layer disposed over the first chip and the second chip, wherein the second dielectric layer is patterned to have first openings each aligned to one of the bumps connecting to the first chip, and to have second openings each aligned one of the plurality of through-holes over the second chip;
   a metal redistribution layer disposed on the second dielectric layer, wherein the metal redistribution layer fills in the first openings and the second openings, wherein the metal redistribution layer is patterned to connect electrically the one or more bumps of the first chip with the second chip;
   under-bump metallization layers on the metal redistribution layer; and a plurality of micro-bumps formed on the metal redistribution layer; wherein the plurality of micro-bumps connects electrically with the first chip through the metal redistribution layer filled in the first openings and the one or more bumps of the first chip, and wherein the plurality of micro-bumps connects electrically with the second chip through the metal redistribution layer filled in the first openings.

2. The packaging structure of the fan-out chip according to claim 1, wherein: the first dielectric layer comprises one of silicon dioxide, phosphorosilicate glass, silicon oxycarbide, silicon carbide and polymer.

3. The packaging structure of the fan-out chip according to claim 1, wherein: the plastic package material comprises polyimide, silica gel and epoxy resin.

4. The packaging structure of the fan-out chip according to claim 1, wherein: a material of the metal redistribution layer comprises aluminum, copper, tin, nickel, gold and silver.

5. The package structure of the fan-out chip according to claim 1, wherein: the plurality of micro-bumps comprises gold-tin solder balls, silver-tin solder balls and copper-tin solder balls.

6. The package structure of the fan-out chip according to claim 1, wherein: the plurality of micro-bumps further comprises a copper post, and a nickel layer formed on the copper post.

7. The package structure of the fan-out chip according to claim 5, wherein the gold-tin solder balls, the silver-tin solder balls or the copper-tin solder balls are formed by a reflow process at a high-temperature followed by decreasing temperature to freeze into solder balls.

* * * * *

UNITED STATES PATENT AND TRADEMARK OFFICE
CERTIFICATE OF CORRECTION

PATENT NO. : 10,593,641 B2
APPLICATION NO. : 15/560965
DATED : March 17, 2020
INVENTOR(S) : Yuedong Qiu et al.

Page 1 of 1

It is certified that error appears in the above-identified patent and that said Letters Patent is hereby corrected as shown below:

In the Claims

In Claim 1, at Column 8, Line 2, delete the text "[fabricated" and replace it with the text --is fabricated--.

Signed and Sealed this
Sixteenth Day of June, 2020

Andrei Iancu
*Director of the United States Patent and Trademark Office*